United States Patent [19]

Tanaka et al.

[11] Patent Number: 4,912,534

[45] Date of Patent: Mar. 27, 1990

[54] NONVOLATILE SEMICONDUCTOR MEMORY DEVICE

[75] Inventors: Sumio Tanaka; Shigeru Atsumi, both of Tokyo; Kenji Shibata, Yokohama; Koichi Kanzaki, Kawasaki, all of Japan

[73] Assignee: Kabushiki Kaisha Toshiba, Kawasaki, Japan

[21] Appl. No.: 394,278

[22] Filed: Aug. 14, 1989

Related U.S. Application Data

[63] Continuation of Ser. No. 167,146, Mar. 11, 1988, abandoned.

[30] Foreign Application Priority Data

Mar. 16, 1987 [JP] Japan ................................. 62-60395

[51] Int. Cl.$^4$ ............................................. H01L 29/78
[52] U.S. Cl. ..................................... 357/23.5; 357/59; 365/185
[58] Field of Search ............................ 357/23.5, 59 G; 365/185

[56] References Cited

U.S. PATENT DOCUMENTS 4,486,769 12/1984 Simko ................................. 357/23.5
4,713,677 12/1987 Tigelaar ............................. 357/23.5

Primary Examiner—Andrew J. James
Assistant Examiner—Mark Prenty
Attorney, Agent, or Firm—Finnegan, Henderson, Farabow, Garrett and Dunner

[57] ABSTRACT

A second impurity diffusion layer is formed in a semiconductor substrate at a fixed distance from a first diffusion layer in the substrate. The diffusion layer is supplied with a program potential. An electrode is placed on the channel region between the first and second diffusion layers. Non-selected memory cells are prevented from becoming half-selected by electrically separating the first diffusion layer from the program potential according to signals from the electrode, resulting in substantial improvements in the reliability of the semiconductor device.

4 Claims, 4 Drawing Sheets

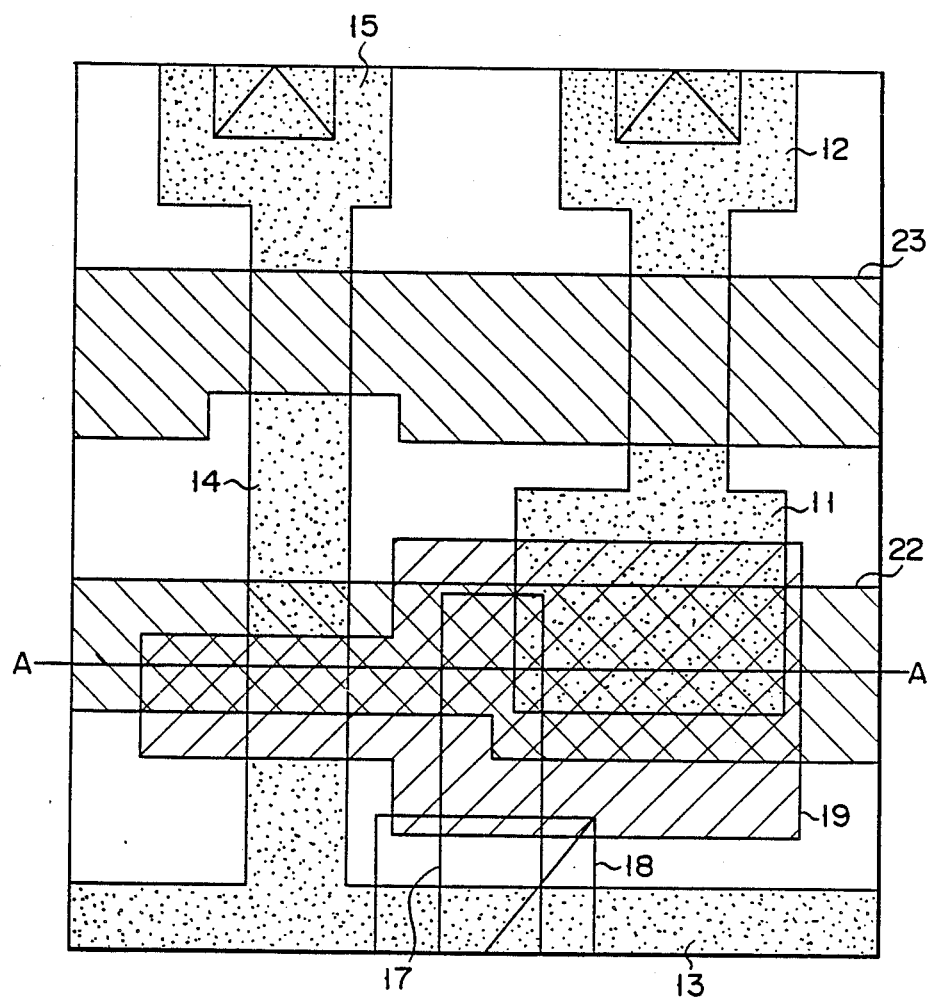
F I G. 3

NONVOLATILE SEMICONDUCTOR MEMORY DEVICE

This application is a continuation of application Ser. No. 167,146, filed Mar. 11, 1988 and now abandoned.

BACKGROUND OF THE INVENTION

This invention relates to a nonvolatile semiconductor memory device, and more particularly to a programmable ROM (read only memory) in which data can be electrically programmed and erased.

Memory cells used in the electrically erasable and programmable ROM are generally expressed as $E^2$PROM and have each the structure as shown in FIG. 1.

In the figure, reference numeral 80 designates a P type semiconductor substrate, and reference numeral 81 and N type impurity diffusion layer to be used as a source region. A first insulating film (not shown) is formed on the diffusion layer 81, and first electrode 82 formed of a first polycrystalline silicon layer is formed on the first insulating film. A second insulating film (not shown) is formed on the first electrode 82, and second electrode 83 formed of a second polycrystalline silicon layer is formed on the first and second insulating films. The second electrode 83 extends above diffusion layer 81. Second electrode 83 is electrically floating. A third insulating film (not shown) is formed on an extended portion of second electrode 83. Third electrode 84 formed of a third polycrystalline layer is formed on the third insulating film. The upper surfaces of first and second electrodes 82 and 83 are each of the asperity or texture structure type. Second electrode 83 is a floating gate electrode and third electrode 84 is a control electrode.

Assume that third electrode 84 is set at high potential Vpp, e.g., +20 V, and first electrode 82 and diffusion layer 81 are both set at ground potential GND (0 V). Under these conditions, capacitance-coupling exists between third electrode 84 and second electrode 83, between second electrode 83 and first electrode 82, and between second electrode 83 and diffusion layer 81. Second electrode 83 has a relatively low potential by means of the capacitance-coupling. As a result, if electron charges have been injected into second electrode 83, the charges are discharged from second electrode 83 to third electrode 84, erasing data.

Assume that high potential Vpp is set to third electrode 84 and diffusion layer 81, and ground potential GND is set to first electrode 82. Then, the potential at the second electrode 83 is placed at a relatively high potential. As a result, charges are injected into second electrode 83 from first electrode 82, thus writing data into the memory cell.

Since second electrode 83 is electrically floating, the injected charges are stored. Thus, memory cells structured as shown in FIG. 1 are nonvolatile.

FIG. 2 shows a schematic illustration of an actual memory device including memory cells each having the above structure, arranged in a matrix fashion. In the figure, the memory cells are designated by 90A to 90C, and the matrix is a 3×3 matrix for simplicity for illustration.

Third electrode lines 91A to 91C are each common to three memory cells arranged in a row. Source lines 92A to 92C also are each common to three memory cells in a row. First electrode lines 93A to 93C are each common to three memory cells arranged in a column.

A problem with the memory cell matrix wiring shown in FIG. 1 is that half-selected memory cells are present in addition to the selected memory cells. More specifically, to select memory cell 90A, only first electrode line 93B is placed in an "L (low)" state, while first electrode lines 93A and 93C are both in an "H (high)" state, and third electrode line 91B is placed in the "H" state, while third electrode lines 91A and 91C are both in the "L" state. Since first electrode lines 93A and 93C and third electrode line 91B are placed in the "H" state, when the potential of the source wiring 92B is relatively low, a small number of electrons are injected into the second electrode of memory cells 90B. This state is the half-selected state of memory cells 90B. Similarly, since first electrode wiring 93B and third electrode wirings 91A and 91C are placed in the "L" level, when the potential of the source wiring 92C is relatively high, a small number of electrons are injected into the second electrode of memory cells 90C. This state is the half-selected state of memory cells 90C.

As described above, in conventional memory devices using such $E^2$PROM, half-selected memory cells are present. When the memory device is used for a long time, erase and rewrite cycles are repeated many times, thus destroying the data in the non-selected memory cells and impairing the reliability of the memory device.

SUMMARY OF THE INVENTION

Accordingly, an object of this invention is to provide a nonvolatile semiconductor memory cell which is reliable and free of a half-selected memory cell.

According to this invention, there is provided a nonvolatile semiconductor memory device comprising a semiconductor substrate (10) of a first conductivity type, a first diffusion layer (11) of a second conductivity type formed in the substrate, an electrically floating first electrode (19) provided above the first diffusion layer (11), with an insulating film (16) between the first electrode (19) and the diffusion layer (11), such that the electrode (19) will overlap with the first diffusion layer (11), a second electrode (17) maintained at a reference potential and placed as to overlap with the first diffusion layer and the first electrode, separated by insulating films (16 and 20), a third electrode (22) that will overlap with the first electrode via an insulating film, a second diffusion layer (12) of a second conductivity type maintained at a fixed distance from the first diffusion layer (11), the second diffusion layer being applied with the program potential, a fourth electrode (23), provided on channel region between the first and second diffusion layers (11 and 12) via an insulating film and on the first substrate (10).

BRIEF DESCRIPTION OF THE DRAWINGS

FIG. 3 shows a view illustrating a pattern of an $E^2$PROM according to an embodiment of this invention.

DETAILED DESCRIPTION OF THE PREFERRED EMBODIMENTS

Some specific embodiments of this invention will be described with reference to the accompanying drawings.

Figure 1:
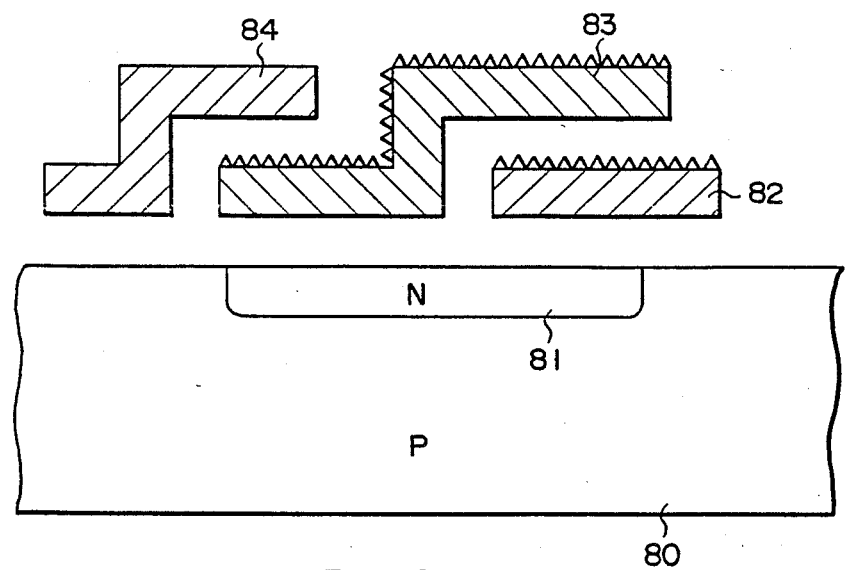
FIG. 1 shows a cross sectional view of a conventional $E^2$PROM.
Figure 2:
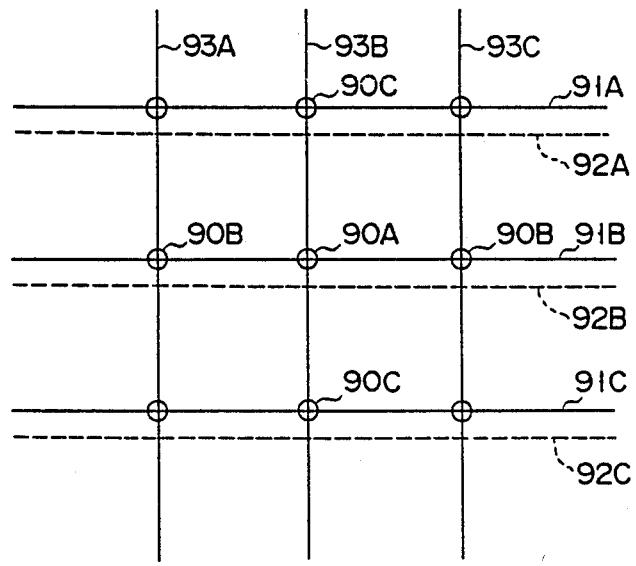
FIG. 2 shows a memory cell matrix using the $E^2$PROM of FIG. 1.
Figure 4:
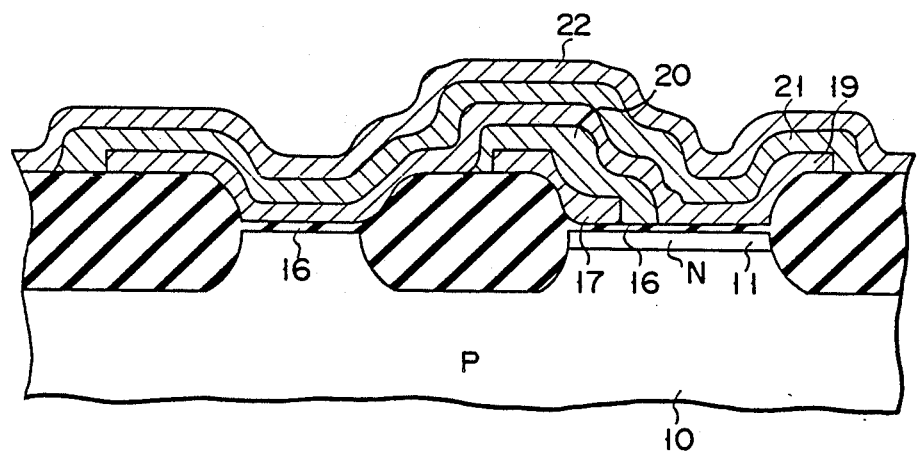
FIG. 4 shows a cross sectional view of the pattern of the $E^2$PROM of FIG. 3, taken on line A—A in FIG. 3.

FIG. 3 shows a plan view of a pattern of the memory cell used in a nonvolatile semiconductor memory device according to this invention. FIG. 4 shows a cross sectional view taken on line A—A in FIG. 3.

In the figure, reference 10 designates a P conductivity type substrate. N conductivity type diffusion layers 11, 12, 13, 14 and 15 are formed in substrate 10. Diffusion layer 12 is supplied with a programming potential. Diffusion layer 13 is connected to ground potential. Diffusion layer 15 is supplied with a reading potential.

Insulating film 16 is formed on diffusion layer 11. Second electrode 17, which is a polycrystalline silicon layer and acts as a first layer, is formed on the insulating film 16. Second electrode 17 is connected to diffusion layer 13 via direct contact section 18. First electrode 19 is a polycrystalline layer and acts as a second layer, and is formed on insulating film 16 laid on diffusion layer 11. First electrode 19 covers second electrode 17 and insulating film 20 layered thereon, and is extended so as to cover the insulating film 16 above the channel region, which is located between the diffusion layers 13 and 14 of substrate 10. The first electrode 19 is electrically floating.

Insulating film 21 is layered on first electrode 19. Third electrode 22, which is a polycrystalline silicone layer and which acts as a third layer, is further formed on the insulating film 21.

Fourth electrode 23, which is a polycrystalline silicone layer and which acts as the third layer, is provided to continuously cover the insulating film (not shown) provided above the channel region between the diffusion layers 11 and 12 of substrate 10 and the insulating film (not shown) provided above the channel region between the diffusion layers 14 and 15.

Figure 5:
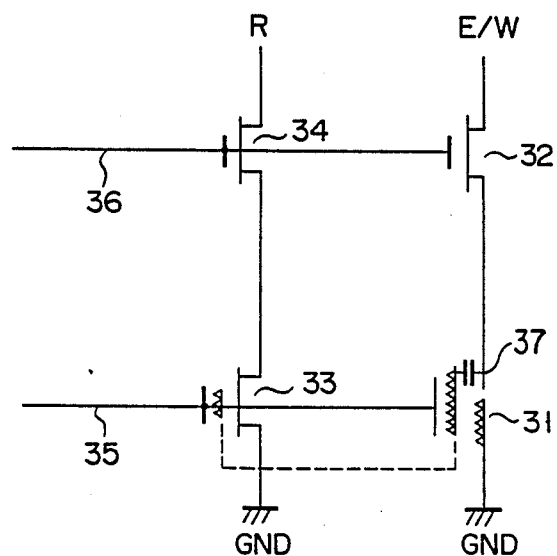
FIG. 5 shows a circuit diagram equivalent to the circuit of the FIG. 3 $E^2$ $PROM$.

FIG. 5 shows an equivalent circuit of the memory cell arranged as shown in FIGS. 3 and 4. In the figure, reference numeral 31 designates an erase/write-in element, 32 designates a select transistor for selecting the erase/write-in element, 33 designates a read-out transistor coupled with the stored data from erase/write-in element 31. Reference numbers 34 designates a transistor for selecting the read-out transistor 33, 35 designates a control electrode, and 36 designates a select electrode. Select transistor 32 and erase/write-in element 31 are connected in series between the program potential E/W and ground potential GND. Select transistor 34 and read-out transistor 33 are connected in series between the read-out potential R and ground potential GND.

Erase/write-in element 31 is a transistor in which diffusion layer 11 is used as a drain, first electrode 19 as a floating gate electrode, and third electrode 22 as a control electrode. A capacitor 37 coupled between the floating gate electrode and the drain of element 31 represents a parasitic capacitance in the region where diffusion layer 11 and first electrode 19 overlap. Select transistor 32 is such a floating gate-type transistor in which diffusion layer 13 is used as a source, diffusion layer 14 as a drain, first electrode 19 as a floating gate electrode, third electrode 22 as a control gate electrode. In select transistor 34, diffusion layer 14 is a source, diffusion layer 15 a drain, and fourth electrode 23 a gate electrode.

To select the transistor with such a structure for programming purposes, high potential Vpp of about +20 V is applied to both select electrode 36 and control electrode 35. Program potential E/W is applied to the drain of select transistor 32. When select electrode 36 is set at high potential Vpp, select electrode 36 is turned on, so that program potential E/W is applied to the drain of erase/write-in element 31.

To erase the data in the selected memory cell, the ground potential is used as the program potential E/W. Since second electrode 17 (shown in FIG. 3) is set to ground potential in the erase/write-in element 31, the potential at the second electrode 19, which is electrically floating, is set at a relatively low potential by the coupling capacitances between third electrode 22 and first electrode 19, the second electrode 17 and first electrode 19, and second electrode 19 and diffusion layer 11. As a result of the low potential, if electrons have been injected into second electrode 19, electrons are discharged from second electrode 19 to third electrode 22, erasing any data.

To write data, a high potential Vpp is applied as the program potential E/W. At this time, a potential near Vpp is applied to the drain of erase/write-in element 31, and the potential at second electrode 19 is set at a relatively high potential. As a result, electrons are injected to second electrode 19 from first electrode 17.

Since second electrode 19 is electrically floating, the injected charge will remain in the electrode unless the cell is erased. Thus, this memory cell has a nonvolatile characteristic.

In programming, select-electrode 36 and control electrode 35 are both at ground in the non-selected memory cell. Therefore, select transistor 32 is turned off, and the program potential E/W is not applied to the drain of erase/write-in element 31. Second electrode 17, set at ground potential, partially overlaps with diffusion layer 11, with insulating film 16 inserted between them. This structure places the drain of erase/write-in element 31 at near ground potential. In erase/write-in element 31 of the non-selected memory cell, second electrode 19, third electrode 22, and diffusion layer 11 are all set at ground potential, resulting in a complete lack of injection or ejection of charge to or from first electrode 19.

In the read-out mode of the memory cell, select electrode 36 and control electrode 35 are both set at +5 V, and read-out potential R at +5 V is applied to the drain of select transistor 34. Select transistor 36 is set at +5 V, turning on select transistor 34 and applying the +5 V read-out potential R to the drain of read-out transistor 33. The floating gate electrode of transistor 33 occupies the same space as erase/write-in element 31. In the case of transistor 33, the threshold voltage is greater than 5 V when electrons are injected into the floating gate (second electrode 19) of erase/write-in element 31, and is less than 5 V when electrons are being discharged. When +5 V potential has been applied to control electrode 35, the transistor 33 is turned on unless electrons have been injected into the floating gate electrode of the element 31, in which case transistor 33 would be turned off. When transistor 33 is in an "on" state, the read-out potential of +5 V, which has been applied to the drain, is reduced to ground potential. On the other hand, when transistor 33 is "off", the potential R of +5 V is maintained. By detecting potential changes with the sense amplifier (not shown), it is possible to know whether the data is a logical "1" or a logical "0".

Figure 6:
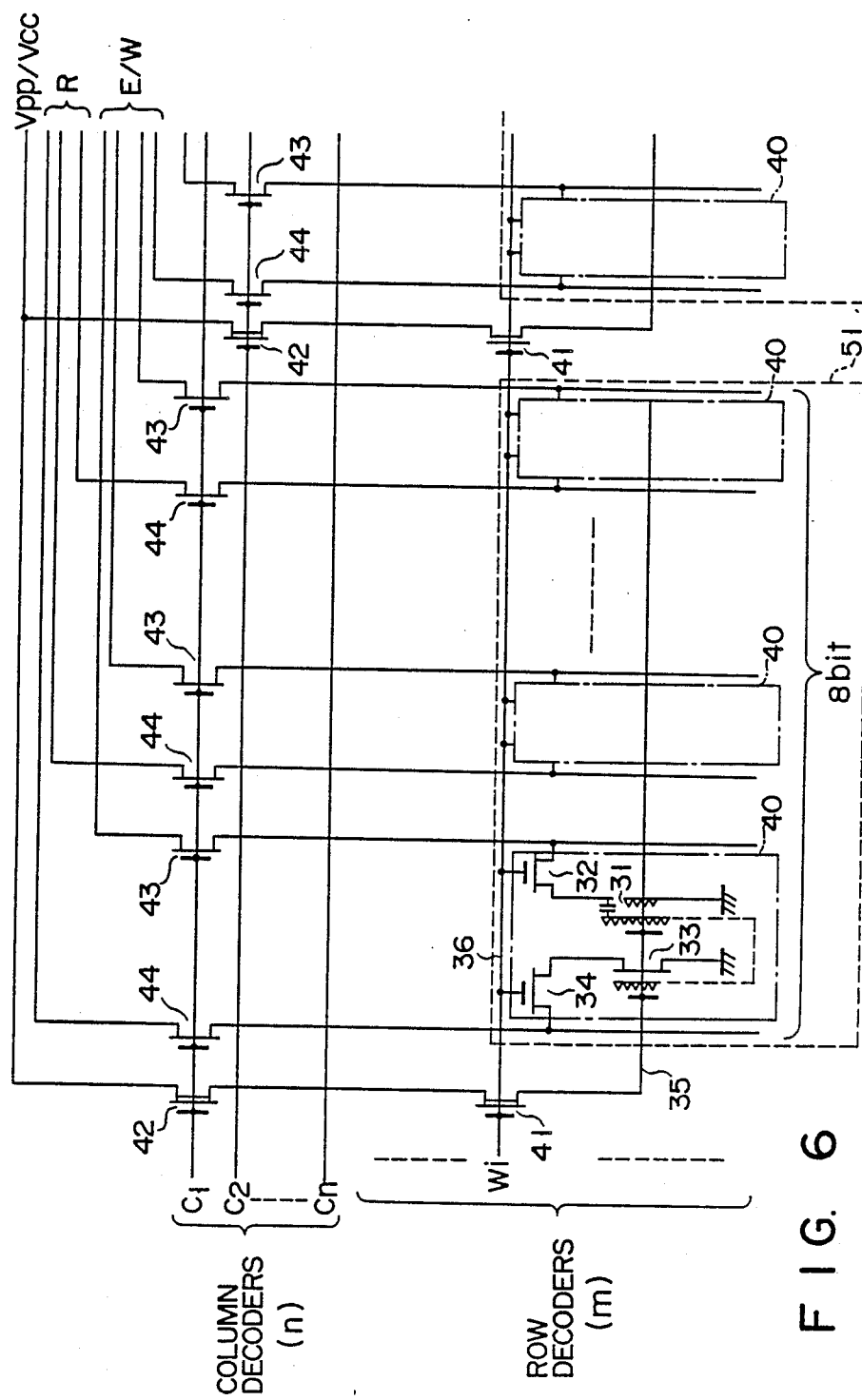
FIG. 6 shows a schematic diagram of a semiconductor memory device using the $E^2$PROM of FIG. 3.

FIG. 6 is a schematic illustration of an application of the invention. The example shown is a memory device based on an 8-bit word length that uses the memory cells shown in FIGS. 3-5.

Although only one memory cell (cell 40) in a single row is shown in the figure, the memory cells are actually arranged in a matrix with m rows. The gates of select transistors 32 and 34 of a plurality of memory cells 40 are connected to select electrode 36 along one row line, i.e., word line Wi(i=1, 2, 3 ... m), to which the output signal from one of the row m decoders is supplied. The drains of select transistors 32 and 34 of each memory cell 40 are connected to their respective column lines. The memory cells along one row line are grouped into 8-cell blocks, which is equivalent to 8 bits, or one word. Although only one block is shown in the figure, there are actually n blocks, corresponding to the number of column decoders. The control electrode 35 for the 8 memory cells 40 in each block 51 is connected to a point for supplying potential Vpp/Vcc through the depletion type MOS transistors 41 and 42. The signal from a row line Wi of memory cells 40 in block 51 are sent to the gate of MOS transistor 41. The signal from the column line C1 in block 51 is sent to the gate of MOS transistor 42. The same thing is true for the other blocks.

The drains from the select transistors 32 within the 8 memory cells 40 in each block 51 are routed to the respective erase/write-in potential E/W through 8 enhancement type MOS transistors 43, which in turn are connected in the column line C1. Furthermore, the drain from each select transistor 34 in the block is connected to the read-out potential R through the respective enhancement type MOS transistors 44, which in turn receive signals from the column line C1 to their gates.

In programming the memory in the above configuration, one of the n column decoders or the m row decoders is set to the high potential Vpp. Let us suppose that both column decoder C1 and row decoder Wi have been set to Vpp. This in turn sets the potential at the control electrode 35 within each memory cell 40 to the high potential Vpp, through the transistors 42 and 41. Furthermore, the erase/write-in potentials E/W are sent through the transistors 43, corresponding to the row line of each memory cell 40, and to the select transistors 32 within the memory cells 40 to the drains from the erase/write-in elements 31, thus enabling programming of the memory cells. In the non-selected memory blocks, on the other hand, the control electrode 35 receives only 2 V from the depletion type transistor 41. This turns off the column selector transistor 43, thus not adding to the drain of erase/write-in element 31. Thus, none of the memory cells are left in a half selected state.

As was discussed above, the memory cells shown in FIGS. 3-5 do not enter the half selected state. Therefore, in memory devices using the memory cells discussed above, destruction of data by non-selected memory cells does not occur, even through extensive use and many repetitions of the erase/write-in cycle. From this result, it is possible to attain remarkable increases in reliability of nonvolatile semiconductor memory devices by using this invention.

What is claimed is:

1. A nonvolatile semiconductor memory device comprising:
   a semiconductor substrate of a first conductivity type;
   a first diffusion layer of a second conductivity type formed in said substrate;
   an electrically floating first electrode provided above said first diffusion layer, with an insulation film positioned between the first electrode and the first diffusion layer, said first electrode being positioned such that the electrode overlaps with said first diffusion layer;
   a second electrode connected to a ground potential and overlapping said first diffusion layer and said first electrode, said second electrode being separated from said first diffusion layer and said first electrode by insulating films;
   a third electrode overlapping said first electrode interposed between a portion of said first diffusion layer and a portion of said first electrode, said third electrode being insulated via an insulating film;
   a second diffusion layer of a second conductivity type formed at a fixed distance from said first diffusion layer, and having a programming potential applied thereto;
   a fourth electrode, provided above a channel region between said first and second diffusion layers, via an insulating film; and
   a third diffusion layer of said second conductivity type formed in said semiconductor substrate and located on a first side of said third electrode, wherein said second electrode is connected to a ground potential.

2. The nonvolatile semiconductor memory device according to claim 1, wherein said first, second, third and fourth electrodes are polycrystalline silicon layers.

3. The nonvolatile semiconductor memory device according to claim 1, further including:
   a fourth diffusion layer of the second conductivity type formed in said substrate and located at a side of said third electrode which is opposite to the first side of the third electrode where said third diffusion layer is located, a fifth diffusion layer of the second conductivity type formed in said substrate a fixed distance from said fourth diffusion layer, and
   wherein said fourth electrode is placed on the channel region between said fourth and fifth diffusion layers.

4. The nonvolatile semiconductory memory device according to claim 1, in which said second electrode is connected to the ground potential via said third diffusion layer.

* * * * *